(12) United States Patent
Janssen et al.

(10) Patent No.: US 12,001,135 B2
(45) Date of Patent: Jun. 4, 2024

(54) METHOD OF MANUFACTURING A MEMBRANE ASSEMBLY

(71) Applicant: ASML NETHERLANDS B.V., Veldhoven (NL)

(72) Inventors: Paul Janssen, Eindhoven (NL); Jan Hendrik Willem Kuntzel, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 432 days.

(21) Appl. No.: 17/413,845

(22) PCT Filed: Dec. 16, 2019

(86) PCT No.: PCT/EP2019/085214
§ 371 (c)(1),
(2) Date: Jun. 14, 2021

(87) PCT Pub. No.: WO2020/126950
PCT Pub. Date: Jun. 25, 2020

(65) Prior Publication Data
US 2022/0057708 A1    Feb. 24, 2022

(30) Foreign Application Priority Data
Dec. 20, 2018 (EP) .................... 18214904

(51) Int. Cl.
G03F 1/64 (2012.01)
G03F 1/62 (2012.01)

(52) U.S. Cl.
CPC . *G03F 1/64* (2013.01); *G03F 1/62* (2013.01)

(58) Field of Classification Search
CPC .................... G03F 1/62; G03F 1/64
USPC ............................................. 430/5
See application file for complete search history.

(56) References Cited

U.S. PATENT DOCUMENTS

| | | | |
|---|---|---|---|
| 10,088,751 B2 | 10/2018 | Yang et al. | |
| 10,228,615 B2 | 3/2019 | Nikipelov et al. | |
| 10,466,585 B2 | 11/2019 | Vles et al. | |
| 10,928,722 B2 | 2/2021 | Janssen et al. | |
| 2011/0065278 A1 | 3/2011 | Kim | |
| 2016/0147141 A1 | 5/2016 | Ono et al. | |
| 2017/0038676 A1 | 2/2017 | Jung et al. | |
| 2017/0090279 A1 | 3/2017 | Ono et al. | |
| 2018/0284598 A1 | 10/2018 | Schnieders | |
| 2019/0056654 A1 | 2/2019 | Peter et al. | |

FOREIGN PATENT DOCUMENTS

| | | |
|---|---|---|
| CN | 106200274 | 12/2016 |
| CN | 106489084 | 3/2017 |
| CN | 106997847 | 8/2017 |
| CN | 108431693 | 8/2018 |
| CN | 108700817 | 10/2018 |
| CN | 108885391 | 11/2018 |
| JP | 2017150064 | 8/2017 |
| JP | 2018531426 | 10/2018 |
| KR | 1020160034803 | 3/2016 |
| KR | 20170067662 | 6/2017 |
| TW | 201725178 | 7/2017 |
| WO | 2017012846 | 1/2017 |
| WO | 2017/036944 | 3/2017 |
| WO | 2017067813 | 4/2017 |

OTHER PUBLICATIONS

Office Action issued in corresponding Taiwanese Patent Application No. 108146590, dated May 24, 2023.
International Search Report and Written Opinion issued in corresponding PCT Patent Application No. PCT/EP2019/085214, dated Feb. 26, 2020.
Vanpaemel, J et al.: "Alternative membrane development at imec", International EUV Initiative (IEUVI) Mask Technology Working Group (TWG) Report, ieuvi.org/TWG/Mask/2016/20160221/4_EUV_Pellicle_TWG_imec.pdf (accessed on Jun. 14, 2021) dated Feb. 21, 2016.
Office Action issued in corresponding Japanese Patent Application No. 2021-532468, dated Nov. 27, 2023.
Office Action issued in corresponding Chinese Patent Application No. 201980084798.3, dated Dec. 29, 2023.

*Primary Examiner* — Christopher G Young
(74) *Attorney, Agent, or Firm* — Pillsbury Winthrop Shaw Pittman, LLP

(57) ABSTRACT

A method of manufacturing a membrane assembly for EUV lithography, wherein a layer which forms at least part of a pellicle membrane is provided after one or more etching steps which define a pellicle border holding the pellicle membrane. Also provided is a pellicle substrate, the substrate including: a stack having a front face and back face, wherein one or more layers on the back face of the stack have been selectively removed to define a pellicle border region for holding the pellicle membrane before the layer which forms at least part of a pellicle membrane has been provided.

20 Claims, 11 Drawing Sheets

METHOD OF MANUFACTURING A MEMBRANE ASSEMBLY

CROSS-REFERENCE TO RELATED APPLICATIONS

This application is the U.S. national phase entry of PCT Patent Application No. PCT/EP2019/085214 which was filed on Dec. 16, 2019, which claims the benefit priority of European Patent Application No. 18214904.7 which was filed on Dec. 20, 2018 and which is incorporated herein in its entirety by reference.

FIELD

The present invention relates to methods of manufacturing a membrane assembly, and to a membrane assembly precursor. The present invention has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g. a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a conventional lithographic apparatus (which may for example use electromagnetic radiation with a wavelength of 193 nm).

A pattern may be imparted to a radiation beam in a lithographic apparatus using a patterning device (e.g. a mask or reticle). Radiation is provided through or reflected off the patterning device to form an image on a substrate. Contamination on the surface of the patterning device can cause manufacturing defects on the substrate. A membrane assembly, also referred to as a pellicle, may be provided to protect the patterning device from airborne particles and other forms of contamination.

Pellicles may also be provided for protecting optical components other than patterning devices. Pellicles may also be used to provide a passage for lithographic radiation between regions of the lithography apparatus which are sealed from one another. Pellicles may also be used as radiation filters, such as spectral purity filters or as part of a dynamic gas lock of a lithographic apparatus.

The use of pellicles in lithography is well-known and well-established. A pellicle in a lithographic apparatus is a membrane (also referred to as a pellicle membrane) which is located away from the patterning device and is out of the focal plane of a lithographic apparatus in use. As the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

A mask assembly may include the pellicle which protects a patterning device (e.g. a mask) from particle contamination. The pellicle membrane may be supported by a pellicle border, forming a pellicle assembly or membrane assembly. The pellicle may be attached to a pellicle frame, for example, by gluing or otherwise attaching a pellicle border to the pellicle frame. The pellicle frame may be permanently or releasably attached to a patterning device. The pellicle membrane may also be known as a pellicle layer. The pellicle membrane is manufactured starting from a stack comprising at least a substrate and a layer deposited on the substrate.

It is difficult to manufacture a pellicle membrane or a pellicle assembly without the membrane assembly being deformed or damaged in the process, for example because of the thinness of the membrane. Damage to or defects in the membrane assembly may lead to reduced performance, reduced lifespan, or even breakup, which are undesired. It is desirable to provide a method of manufacturing a pellicle membrane which provides pellicles with improved yield and/or strength, and which minimises damage to or defects in the membrane assembly.

It is also time consuming to produce pellicle assemblies. It is therefore desirable to provide a method of manufacturing a pellicle which has a reduced cycle time compared to existing methods and/or which allows for the quicker production of pellicle assemblies.

Whilst the present application generally refers to pellicles in the context of lithography apparatus, in particular EUV lithography apparatus, the invention is not limited to only pellicles and lithography apparatus and it is appreciated that the subject matter of the present invention may be used in any other suitable apparatus or circumstances. In addition, the present invention may not be particularly limited to EUV lithography and may also be used for lithography using radiation of longer or preferably shorter wavelength than EUV.

Due to the presence of the pellicle in the optical path of the EUV radiation beam, it is necessary for the pellicle to have high EUV transmissivity. A high EUV transmissivity allows a greater proportion of the incident radiation through the pellicle. In addition, reducing the amount of EUV radiation absorbed by the pellicle may decrease the operating temperature of the pellicle. Since transmissivity is at least partially dependent on the thickness of the pellicle, it is desirable to provide a pellicle which is as thin as possible whilst remaining reliably strong enough to withstand the sometimes hostile environment within a lithography apparatus. The desired characteristic of the pellicle being as thin as possible means that the pellicle membrane itself is susceptible to damage during manufacture. Small defects or areas of damage in a very thin membrane can be deleterious to the physical properties of the membrane.

It is desirable to reduce the possibility of a membrane assembly such as a pellicle being deformed or damaged during its manufacture as any flaws in the pellicle can reduce the performance and/or the lifespan of the pellicle. It is also desirable to increase the yield of undamaged pellicles during manufacture as the process of manufacturing a pellicle is time-consuming and expensive.

Etching is a common manufacturing process used to remove portions of material. In multi-layered materials, selective etching can remove a portion of an outer layer such that an underlying layer is exposed. A well-defined layer thickness is beneficial as etching usually occurs at a fixed rate with respect to time and, as such, a thick layer will take longer to etch than a thin layer. It can similarly be understood that an uneven layer thickness will provide disparity in etch times depending on the layer thickness in each portion of a layer. Over-etching may occur when more material than desired is removed. Over-etching may occur on films with uneven layer thickness as thinner portions of the layer may etch before thicker portions of the layer have completed etching. This may result in an underlying or overlying layer, depending on which side of the stack is being etched, being damaged by over-etching. Over-etching in pellicle manufacture may cause damage to the pellicle film. It is therefore desirable to reduce the chance of over-etching. It is also desirable to develop a manufacturing process to aid the deposition of layers with well-defined layer thickness, and/or remove portions of material in a controlled manner in order to achieve pellicle membranes and pellicle assemblies with reliable and consistent properties.

The present invention has been devised in an attempt to address at least some of the problems identified above.

SUMMARY OF THE INVENTION

According to a first aspect of the present invention, there is provided a method of manufacturing a pellicle membrane and/or a pellicle assembly for EUV lithography, wherein a layer which forms at least part of a pellicle membrane is provided after one or more etching steps which define a pellicle border holding the pellicle membrane.

The manufacture of pellicles comprises multiple steps of material deposition and removal using methods such as, but not limited to, chemical vapour deposition, etch masking, and etching. During these processes, the stack is handled and may be manipulated to bring it into the desired orientation. In some stages, the stack may be flipped over and in other stages, the stack may be held in place using fixing mechanisms, such as chucks. These chucks may provide a force onto the layers in the stack during manufacture, which may result in damage. The chucks may also scratch or otherwise damage one or more layers in the stack.

In other methods of manufacturing pellicle membranes and membrane assemblies for EUV lithography, the layer or layers which ultimately form the pellicle membrane are deposited at an early stage. This is so that the pellicle membrane layer is deposited or otherwise provided on a clean surface which is substantially free of contaminants or defects. Following the deposition of the layer or layers which will ultimately form the pellicle membrane, further deposition, protection, and etching steps are carried out to form the ultimate pellicle membrane or pellicle assembly. However, during the further processing steps the layer or layers which will form the ultimate pellicle membrane may become damaged. With other manufacturing methods, the ultimate pellicle membrane layer is covered by other layers until a late stage of the process. As such, if there are any defects in or damage to the ultimate pellicle membrane, these are not uncovered until a number of complex and time-consuming steps have been carried out. Therefore, almost the entire manufacturing process must be carried out before defective pellicle membranes can be identified and disposed of. The time taken between identification of a fault and the creation of a new pellicle assembly may be referred to as the learning time. The method according to the present invention has the advantage that the learning time is reduced.

In the method according to the first aspect of the present invention, the layer or layers which ultimately form the pellicle membrane are provided at a later stage of the process than in other methods. In the present invention, the ultimate pellicle membrane layer is deposited only after certain etching steps have taken place. The ultimate pellicle assembly comprises a pellicle border which holds the pellicle membrane. The pellicle border may be mechanically or chemically attached to a pellicle frame. The pellicle frame may be releasably or permanently attached to the patterning device MA. By pellicle membrane, it is understood that this refers to the layer or layers of material which span the pellicle border portion and through which, in use as a pellicle, EUV radiation passes. The layer may also be referred to as the pellicle layer, pellicle core layer or pellicle membrane. The material which forms the pellicle membrane is provided after the etching step or steps which define the pellicle border have taken place. It should be appreciated that this does not require that the pellicle border has been formed, but rather that the layer or layers which protect the portion of the layer, such as a planar substrate, which ultimately becomes the pellicle border from subsequent etching steps have been defined. For example, where the stack comprises a silicon planar substrate that forms the ultimate pellicle border holding the pellicle membrane, the etching steps which define the ultimate pellicle border may comprise etching one or more layers which serve to protect the portion of the planar substrate that ultimately forms the pellicle border from etching.

It has been surprisingly realised that it is possible to provide the layer or membrane which ultimately forms at least part of the ultimate pellicle membrane after some etching steps have been carried out without being detrimental to the quality of the ultimate pellicle membrane. In addition, the method of the present invention can also reduce the time required to produce pellicle assemblies in that it is possible to carry out some of the steps required to manufacture a pellicle assembly or pellicle membrane starting from a stack before the layer or membrane which is to become the ultimate pellicle membrane is provided. In other methods of manufacturing which require the pellicle membrane layer to be deposited at an early stage, if a membrane assembly having a particular pellicle membrane is required, it is necessary to start from the beginning of the process with forming the pellicle membrane. In contrast, with the method of the present invention, it is possible to effectively begin with the pellicle membrane layer formation part way through the entire process, thereby saving time.

The method may comprise providing a stack having a front face and a back face. A stack may comprise a substrate with one or more layers. For example, the stack may comprise a planar substrate, such as a silicon wafer or a silicon on insulator (SOI) wafer.

The method may also comprise providing a protective layer on the front face of the stack. The protective layer may be any suitable material that is able to protect underlying portions of the stack from subsequent etching processes. The invention is not particularly limited by the nature of the protective layer.

The method may also comprise selectively removing one or more portions from the back face of the stack. These portions may serve to define the pellicle border of the ultimate pellicle assembly. The selective removal can be carried out by any suitable technique and the invention is not particularly limited by the technique used. During manufacturing processes such as resist deposition, patterning, and etching, the stack must be held in place or moved using fixing mechanisms, also known as chucks. In alternative manufacturing methods, these chucks may provide a force onto the pellicle layers during manufacture, which may further result in damage to the pellicle. An advantage of the present invention is that the selective removal of at least a portion of the back face of the stack is completed prior to the deposition of the at least one membrane layer, ensuring that chucks do not apply a force to the membrane layer at this point. This reduces the possibility of the pellicle membrane or layer being damaged during processing.

The method may also comprise removing at least a portion of the protective layer from the front face of the stack. Once the back of the stack has been etched, the protective layer on the front face of the stack may be removed as it no longer requires protection from etching. The removal of the protective layer may be achieved by any suitable technique and the invention is not particularly limited to the technique used.

The method may also comprise providing the layer which forms at least part of a pellicle membrane on the front face of the stack. Whilst it will be appreciated that preferably a protective layer is provided on the front face of the stack in order to protect the front face of the stack during an etching step, this may not be required and it may be possible to etch the back face of the stack without providing any protective layer on the front face of the stack. Since the etching of the back face of the stack has been completed prior to the layer which forms at least part of the pellicle membrane is provided, this reduces the risk of damage being caused to such pellicle layer. The present invention is not particularly limited to how the pellicle layer is provided and any suitable technique, such as, for example, chemical vapour deposition, may be used.

The method may further comprise selectively removing one or more portions of the stack to form a pellicle assembly. Thus, the pellicle assembly may comprise a pellicle membrane comprising the at least one membrane layer and a pellicle border holding the pellicle membrane. The one or more portions from the stack may be removed by any suitable technique and the present invention is not particularly limited by the technique or techniques used. For example, etching may be used to remove the one or more portions. The method may comprises one or more steps to selectively removed one or more portions of the stack to form a pellicle assembly.

The method may further comprise: providing at least one emissive layer on the front face of the stack such that the pellicle assembly comprises a membrane comprising the at least one membrane layer and the at least one emissive layer. The emissive layer is preferably provided after the at least one membrane layer has been provided. The emissive layer may be provided below the at least one membrane layer, or both above and below the at least one membrane layer. As such, the emissive layer may be provided on the front, back, or both sides of the pellicle membrane. The emissive layer may serve to increase the thermal emissivity of the pellicle assembly. The increase in the emissivity of the pellicle assembly may reduce the operating temperature of the pellicle which may in turn increase the lifespan of the pellicle. In addition, the emissive layer may also protect the membrane layer from the atmosphere within the lithographic apparatus. For example, where the pellicle layer comprises carbon, the low pressure hydrogen within the lithographic apparatus can be ionised by the radiation and the hydrogen radicals can attack the carbon and weaken the pellicle over time. The emissive layer may therefore also protect the pellicle membrane layer. Where the emissive layer is provided on the back of the at least one membrane layer, it may also be provided on an inside face of the border. Alternatively or additionally, the emissive layer may also be provided on the lowermost portion of the border, i.e. the "feet" of the border. Although it may be possible to only provide the emissive layer on the membrane layer, it may be more convenient to simply coat the lowermost face of the assembly with the emissive layer.

The method may further comprise providing at least one capping layer on the front face of the stack, wherein said capping layer preferably comprise silicon dioxide and/or silicon nitride. Other capping layers may also be used. The capping layer may be provided by any suitable technique and the invention is not particularly limited to the technique used. In an example, tetraethyl orthosilicate (TEOS) may be provided and subsequently converted into silicon dioxide using known techniques. The capping layer may serve to protect the pellicle core layer of the stack. The capping layer may have better compatibility with overlying layers and thereby result in a stronger bond between layers in the stack. Thin layers of silicon dioxide are easily grown with a well-known layer thickness as is known in the art. Layers of well-known thickness are advantageous to etching processes as it reduces the risk of over-etching in some areas of a layer due to uneven layer thickness. Deposition of thin layers of silicon dioxide as capping layers may subsequently increase the reliability of etching and may reduce the chance of damage to membranes.

The method may comprise providing a resist on the stack and patterning the resist prior to step selectively removing one or more portions from the back face of the stack. The invention is not particularly limited by the nature of the resist and any suitable resist may be used. This step is to provide a mask that allows definition of patterns on the surface of the stack, for example for definition of the pellicle border region on the stack. The resist may be patterned in such a way so as to define the ultimate pellicle border of the final pellicle assembly. The resist serves to protect the underlying layers from etching. As such, the patterning of the resist serves to define the areas of the stack which are removed by a subsequent etching step. The etchant may be a chemical etchant, such as, for example, phosphoric acid ($H_3PO_4$) and/or hydrofluoric acid (HF). After etching, the resulting pellicle membrane may comprise for example a MoSiNx pellicle core layer with native oxide layers on one or both of its surfaces. Herein, x means a variability of nitrogen in the material composition, which variability can equivalently also be described as $Mo_xSi_pN_z$. Alternatively, after etching and metal deposition the stack may be formed for example by SiN/Ox on front surface/pSi pellicle core layer/low stress nitride (LSN) and a cap of Mo/Ru on the back side of the stack (e.g. in the cavity defined by the pellicle border).

The method may further comprise etching at least a portion of the stack during the step of selectively removing one or more portions from the back face of the stack and/or the step of selectively removing one or more portions of the stack to form a pellicle assembly.

The stack may comprise a planar substrate and preferably at least one sacrificial layer. The planar substrate may be a wafer. The planar substrate may form the pellicle core layer of the stack. Preferably, the wafer comprises silicon. Silicon is a well characterised material which is commonly used in the field. It will be appreciated that other suitable materials could be used and that the invention is not limited to a silicon based substrate (i.e. a substrate comprising silicon, such as pSi, SiC, MoSi2 or MoSiNx). For example, the substrate may also be carbon based, such as a graphene pellicle core layer or a carbon nanotube pellicle core layer for the stack.

The method may further comprise the deposition of one or more further sacrificial layers, for example during deposition of the at least one membrane layer. This is preferably followed by the selective removal of one or more portions of the additional sacrificial layers. The sacrificial layer may comprise silicon nitride and/or silicon oxide. Other materials may also be used as the sacrificial layer, depending on the material of the pellicle core layer.

The at least one membrane layer may comprise at least one silicon layer preferably formed by crystallizing at least one amorphous silicon layer. The membrane layer may comprise pSi. Silicon has good EUV transmissivity so is a suitable material for the at least one membrane layer. The at least one membrane layer may be coated with one or more materials which serves to provide additional chemical or thermal resistance, and/or which increase the emissivity of the membrane assembly.

The protective layer may comprise a cross-linked polymer. The polymer may be a poly(p-xylylene) polymer. The polymer may be Parylene or ProTek® type material. It may alternatively or additionally comprise a resist, such as for example, KMPR™.

The at least one membrane layer may be disposed between the at least one emissive layer and the front face of the stack. It will be appreciated that an emissive layer may be provided on one or both sides of the membrane layer in some embodiments. In an embodiment the membrane layer does not have an emissive layer or other capping layers and it is formed only by the at least one pellicle core layer. For example, the pellicle is only formed by a MoSiNx pellicle core layer.

The at least one emissive layer may be metallic. The at least one emissive layer may comprise boron or a boron-containing material, or Zr or a Zr containing material. Boron-containing materials, for example metal-alloys of boron such as zirconium diboride ($ZrB_2$) are able to increase the emissivity of the pellicle and is also able to protect the membrane layer.

Preferably, the at least one emissive layer may further comprise three metallic emissive layers. In this embodiment, the three emissive layers may comprise a zirconium layer disposed between two boron layers, wherein the zirconium layer may comprise zirconium or a zirconium-containing material, and wherein the boron layers may comprise boron or a boron-containing material. In another alternative the emissive layer may comprise layers of B, Zr, Ru or Mo. Other emissive layer may be used.

The at least one capping layer has capping layer thickness, the at least one membrane layer has a membrane layer thickness, and the capping layer thickness is preferably less than the membrane layer thickness. For example the capping layer can have a thickness from 0.5 to 10 nm, preferably from 1 to 5 nm. In this way, the membrane layer provides the majority of the physical strength of the pellicle membrane in the pellicle assembly.

The method may further comprise the selective removal of at least one portion of the at least one capping layer after selectively removing one or more portions of the stack to form a pellicle assembly.

The at least one membrane layers and/or at least one capping layers and/or at least one emissive layers may further be provided with at least one sacrificial layer. The method may further comprise the provision of additional sacrificial layers, for example before, during, or after deposition of the at least one membrane layer. This is preferably followed by the selective removal of one or more portions of the additional sacrificial layers.

According to a second aspect of the present invention, there is provided a pellicle substrate, the substrate comprising: a stack with a front face and back face, wherein one or more layers on the back face of the stack have been selectively removed to define a pellicle border region for holding the pellicle membrane before the layer which forms at least part of a pellicle membrane has been provided.

The present invention allows for the provision of a pellicle substrate which has been partially processed. Since the processing of a pellicle substrate can take a number of weeks, by being able to provide a pellicle substrate which has been partially processed, it is possible to hold such substrates in storage until they are required and so the time taken between the order for a membrane assembly having a particular pellicle membrane is reduced. During manufacture, defects in the pellicle layer may be identified, in which case the pellicle must be abandoned and a new pellicle assembly fabricated. According to the above aspect of the present invention, the manufacturing process can be continued from the provision of a pellicle substrate rather than from the start, hence reducing the learning time of the manufacturing process.

The pellicle substrate may in an embodiment be free from the layer which is to form at least part of the pellicle membrane. In such an embodiment, the pellicle substrate has been processed such that the ultimate pellicle border region has been defined, but the material forming the pellicle membrane is not present. In this way, different pellicle membrane materials can be provided and investigated or used more rapidly than previously.

In another embodiment, the pellicle substrate comprises the material which is to form the ultimate pellicle membrane. However, this is provided after the processing steps which define the ultimate pellicle border region have been performed.

Preferably, the pellicle substrate comprises at least one protective layer on the front face, preferably the at least one protective layer comprises a cross-linked polymer, preferably a poly(p-xylylene) polymer, preferably a Parylene or ProTEK® type material or a resist, such as KMPR™.

The stack may comprise a planar substrate, and preferably at least one sacrificial layer; preferably wherein the planar substrate is a wafer, optionally a silicon wafer or a SOI wafer; and preferably wherein the at least one sacrificial layer comprises silicon nitride.

According to a further aspect of the invention, there is provided a pellicle assembly manufactured according to a method comprising any of the above described methods.

The method according to the invention has in an embodiment as result that, after etching, the pellicle membrane comprises a MoSiNx core layer with no further functional cap layers, or a MoSiNx core layer having at least one surface covered with a native oxide layer.

The method according to the invention has in an embodiment as result that, after etching and metal deposition, the pellicle stack is formed by SiN/Ox on the front face, a pSi pellicle core layer, a low stress nitride (LSN) layer and a cap layer of Ru on Mo which is deposited on the back face of the stack.

In a further aspect of the invention the pellicle substrate comprises a pellicle core layer which can be selected from a silicon-based material, such as pSi, SiC, MoSi2 or MoSiNx, or a carbon-based material, such as a graphene film or a film formed by carbon nanotubes.

In yet another aspect of the invention the pellicle stack comprises the layers of SiO/MoSiNx/MoSi2 or comprises the layers of SiON/MoSiNx/SiON. However, combinations of only two of these layers are also envisaged herein.

Although it will be appreciated that the ultimate pellicle provided by the present invention is fundamentally the same as pellicle assemblies manufactured using other methods, the provision of the pellicle layer at a later stage of the process has a number of benefits as detailed above which have not previously been realized.

It will be appreciated that any of the above-discussed aspects of the invention may, where appropriate, be combined with one or more other aspects of the invention. Furthermore, an optional feature described in relation to one of the aspects of the invention may, where appropriate, be an optional feature of one of the other aspects of the invention.

BRIEF DESCRIPTION OF THE DRAWINGS

Embodiments of the invention will now be described, by way of example only, with reference to the accompanying schematic drawings in which.

Figure 1:
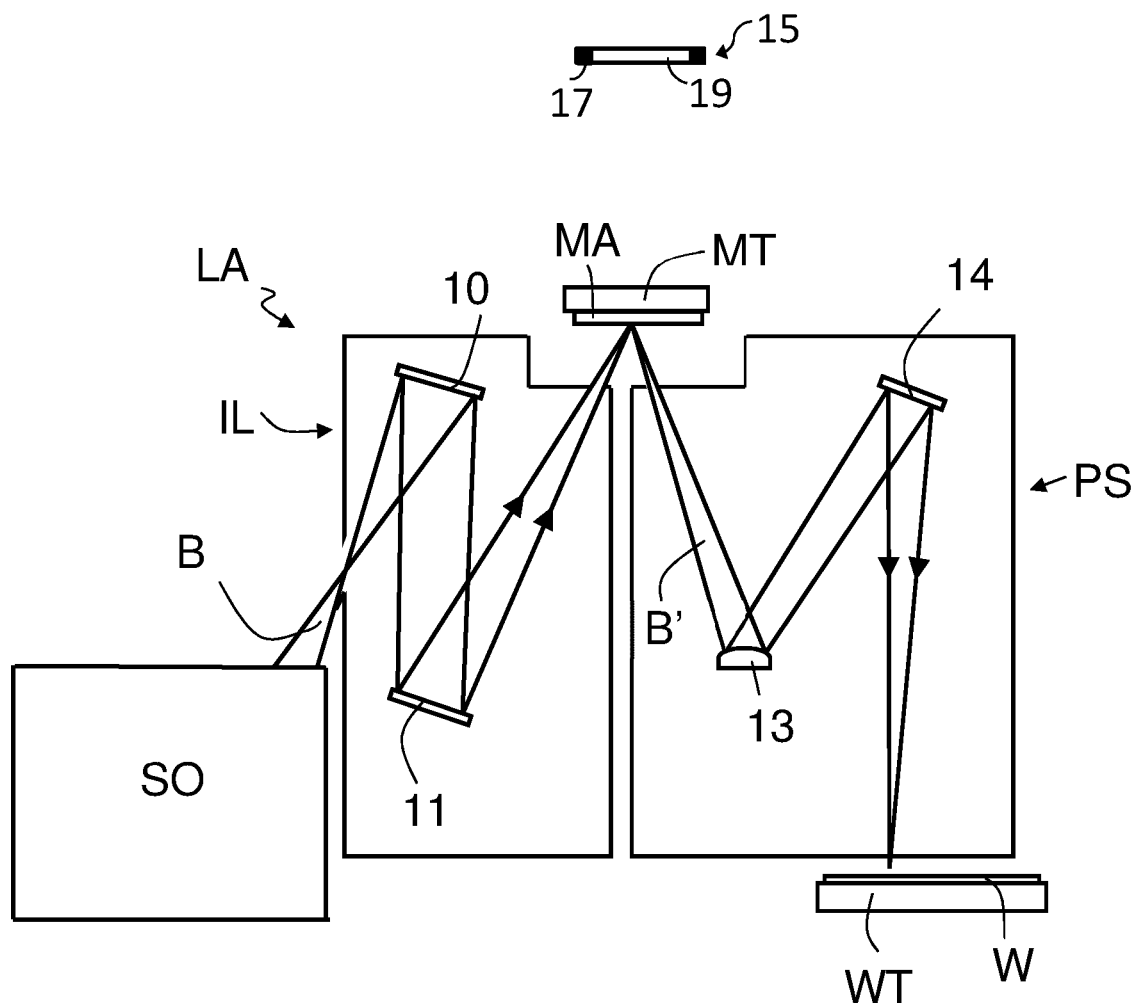
FIG. 1 depicts a lithographic system comprising a lithographic apparatus including a pellicle assembly.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 shows a lithographic system including a pellicle 15 (also referred to as a pellicle assembly) manufactured according to the method of the first aspect of the present invention. The lithographic system comprises a radiation source SO and a lithographic apparatus LA. The radiation source SO is configured to generate an extreme ultraviolet (EUV) radiation beam B and to supply the EUV radiation beam B to the lithographic apparatus LA. The lithographic apparatus LA comprises an illumination system IL, a support structure MT configured to support a patterning device MA (e.g. a mask), a projection system PS and a substrate table WT configured to support a substrate W.

The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W. In this embodiment, the pellicle assembly 15 is depicted in the path of the radiation and protecting the patterning device MA. It will be appreciated that the pellicle assembly 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO may take any form, and may be for example a type which may be referred to as a laser produced plasma (LPP) source. In an alternative example, the radiation source SO may comprise one or more free electron lasers. The one or more free electron lasers may be configured to emit EUV radiation that may be provided to one or more lithographic apparatus.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA is protected by a pellicle layer 19, which is held in place by a pellicle border 17. The pellicle layer 19 and the pellicle border 17 together form the pellicle assembly 15. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

As was described briefly above, the pellicle assembly 15 includes a pellicle layer 19 that is provided adjacent to the patterning device MA. The pellicle layer 19 is provided in the path of the radiation beam B such that radiation beam B passes through the pellicle layer 19 both as it approaches the patterning device MA from the illumination system IL and as it is reflected by the patterning device MA towards the projection system PS. The pellicle layer 19 comprises a thin film that is substantially transparent to EUV radiation (although it will absorb a small amount of EUV radiation). The pellicle layer 19 acts to protect the patterning device MA from particle contamination. The pellicle layer 19 may be herein referred to as an EUV transparent pellicle.

Whilst efforts may be made to maintain a clean environment inside the lithographic apparatus LA, particles may still be present inside the lithographic apparatus LA. In the absence of a pellicle layer 19, particles may be deposited onto the patterning device MA. Particles on the patterning device MA may disadvantageously affect the pattern that is imparted to the radiation beam B and therefore the pattern that is transferred to the substrate W. The pellicle layer 19 provides a barrier between the patterning device MA and the environment in the lithographic apparatus LA in order to prevent particles from being deposited on the patterning device MA.

In use, the pellicle layer 19 is positioned at a distance from the patterning device MA that is sufficient that any particles that are incident upon the surface of the pellicle layer 19 are not in the focal plane of the radiation beam B. This separation between the pellicle layer 19 and the patterning device MA, acts to reduce the extent to which any particles on the surface of the pellicle layer 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some embodiments, the separation between the pellicle layer 19 and the patterning device MA may, for example, be between 2 mm and 3 mm (e.g. around 2.5 mm). In some embodiments, a separation between the pellicle layer 19 and the patterning device may be adjustable.

In an embodiment the pellicle assembly 15 is for a dynamic gas lock. In this case the membrane assembly 15 functions as a filter for filtering DUV radiation. Additionally or alternatively, in an embodiment the membrane assembly 15 is a pellicle for the patterning device MA for EUV lithography. The membrane assembly 15 of the present invention can be used for a dynamic gas lock or for a pellicle or for another purpose. In an embodiment the membrane assembly 15 comprises a membrane formed from the at least one membrane layer configured to transmit at least 90% of incident EUV radiation. In order to ensure maximised EUV transmission and minimized impact on imaging performance it is preferred that the membrane is only supported at the border.

Figure 2:
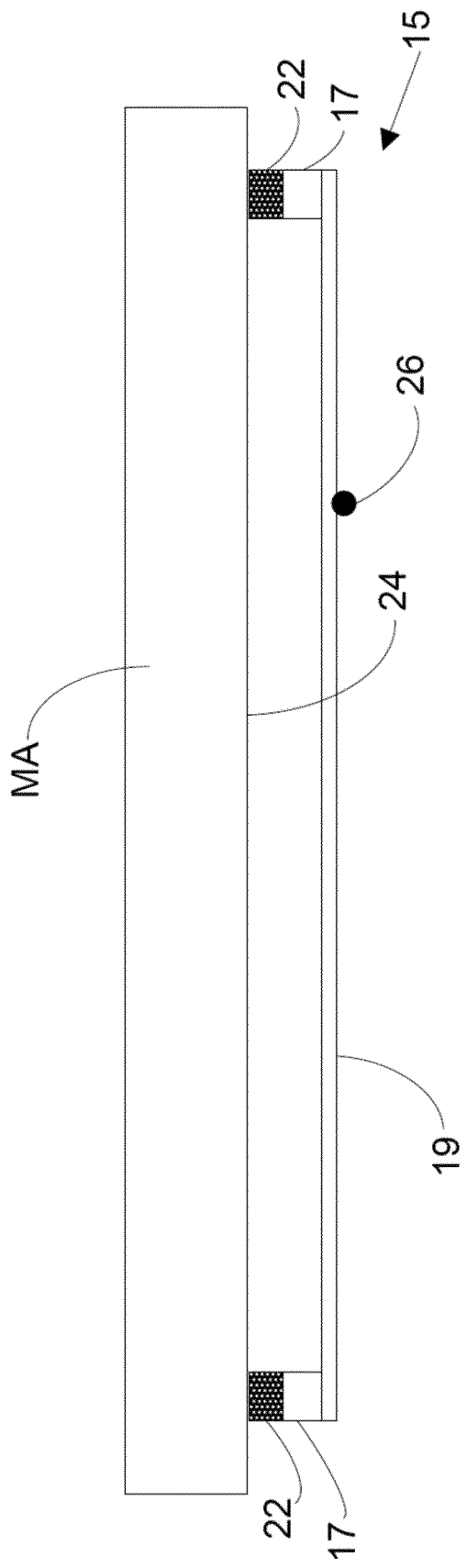
FIG. 2 depicts a pellicle assembly.

FIG. 2 is a schematic illustration of the pellicle assembly 15 and the patterning device MA in cross-section and in more detail. The patterning device MA has a patterned surface 24. The pellicle border 17 supports the pellicle layer 19 around a perimeter portion of the pellicle layer 19. The pellicle border 17 may be attached to a pellicle frame 22. The pellicle frame 22 may include an attachment mechanism (not shown) configured to allow the pellicle frame 22 to be removably attachable to the patterning device MA (i.e. to allow the pellicle frame 22 to be attachable to and detachable from the patterning device MA). The attachment mechanism is configured to engage with an attachment feature (not shown) provided on the patterning device MA. The attachment feature may, for example, be a protrusion which extends from the patterning device MA. The attachment mechanism may, for example, comprise a locking member which engages with the protrusion and secures the pellicle frame 22 to the patterning device MA. A plurality of attachment mechanisms and associated attachment features may be provided. The attachment mechanisms may be distributed around the pellicle frame 22 (e.g. two on one side of the pellicle frame and two on an opposite side of the pellicle frame). Associated attachment features may be distributed around the perimeter of the patterning device MA.

A contamination particle 26 is schematically shown in FIG. 2. The contamination particle 26 was incident upon the pellicle layer 19 and is held by the pellicle layer 19. The pellicle layer 19 holds the contamination particle sufficiently far from the patterned surface 24 of the mask MA that it is not imaged onto substrates by the lithographic apparatus LA.

A pellicle assembly according to an embodiment of the invention may allow a mask pattern (on the patterning device) to be provided which remains substantially defect free during use (the mask pattern is protected from contamination by the pellicle).

The pellicle assembly 15 may be constructed by depositing the pellicle layer 19 (which may be a pellicle core layer made of, for example polysilicon (pSi) or MoSiNx) directly on top (front face) of a substrate which is to provide the pellicle border 17. For example the stack may be SiO/MoSiNx/MoSi2 or SiON/MoSiNx/SiON. The substrate may be, for example, a silicon wafer or a SOI wafer. After deposition of the film of the pellicle layer 19, the substrate may be selectively back-etched (i.e. etched at the back face) to remove a central portion of the substrate and leave only an outer perimeter to form the pellicle border 17 to support the pellicle layer 19. The fabrication process will hereby be discussed with reference to the following figures.

Figure 3:
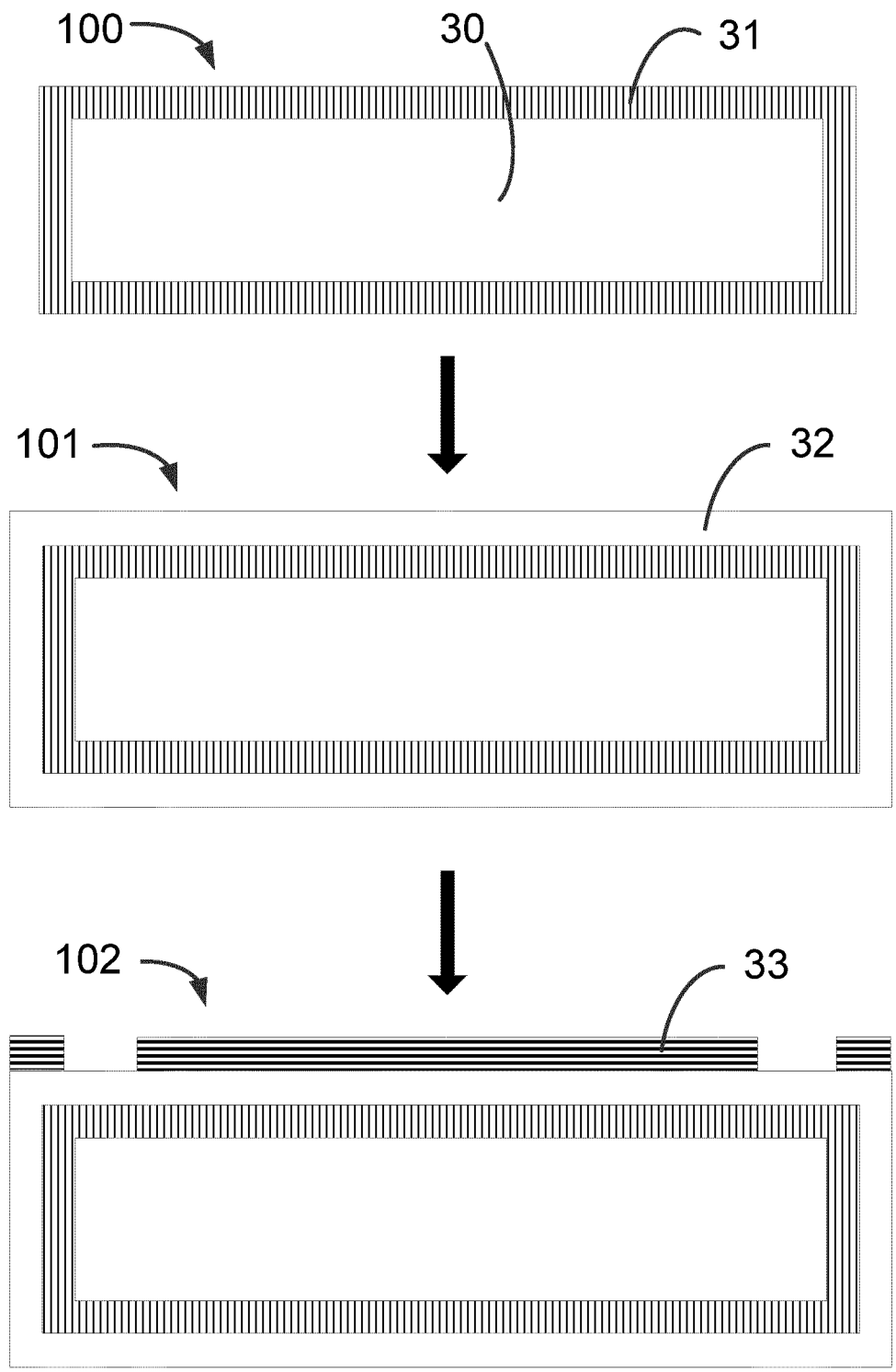
FIG. 3 illustrates stages of manufacture of a pellicle assembly according to a method other than the one according to the present invention, using a cross-section of the stack for illustration.
Figure 3:
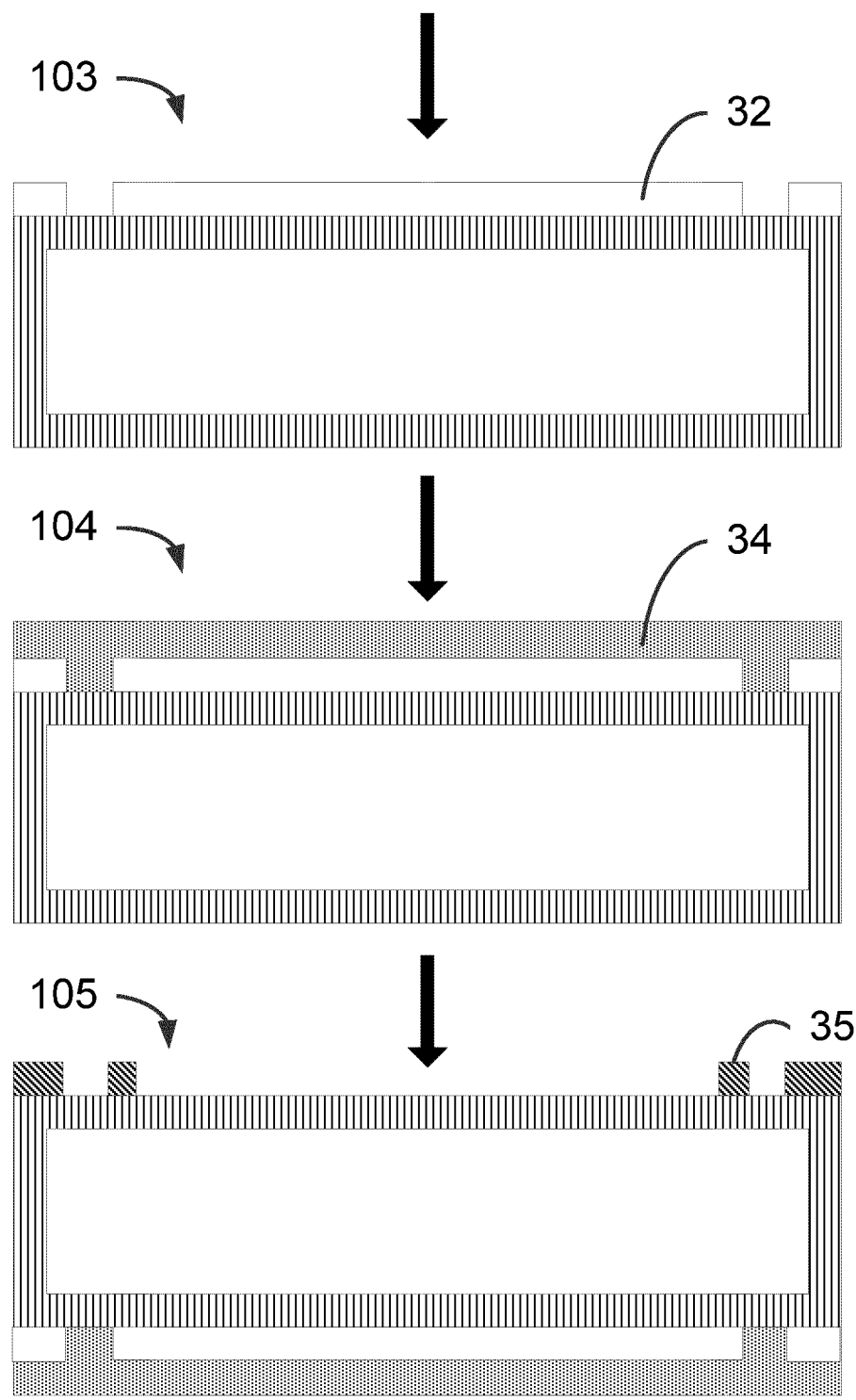

FIG. 3 schematically illustrates stages of manufacture of a pellicle assembly according to an alternative manufacturing process, different to the method of the present invention, using a cross-section of the stack for illustration. This method is included to provide a comparison with the method of the present invention.

A stack 100 is provided, comprising a planar substrate 30 and a first optional sacrificial layer 31. The planar substrate 30 is disposed in an inner region of the stack 100 and the first sacrificial layer 31 is disposed in an outer region of the stack 100. As such, the first sacrificial layer 31 preferably substantially surrounds the planar substrate 30. The planar substrate 30 may be, for example, a silicon wafer or a SOI wafer. The planar substrate 30 has a shape such as a square, a circle or a rectangle, for example. The shape of the planar substrate 30 is not particularly limited, but is most likely circular as this is the most commonly available shape. The size of the planar substrate 30 is not particularly limited.

The first sacrificial layer 31 is depicted as completely surrounding the planar substrate 30, but in some embodiments, the first sacrificial layer 31 may only partially surround the planar substrate 30. In the depicted embodiment, a single sacrificial layer 31 is shown, but it will be appreciated that there may be more than sacrificial layer 31 present. The first sacrificial layer may comprise, for example, silicon oxide, silicon nitride, tetraethyl orthosilicate (TEOS), a chemical oxide or a thermal oxide.

The stack 100 has a front face and a rear face (also referred to as back face). The front face is defined as the face proximal to the pellicle layer in later stages of manufacture. The front and rear face may be designated prior to the deposition of a pellicle layer. These terms are used to provide a better understanding of the invention and to more clearly define the steps in the process. However, the method is also intended to cover cases where the stack is flipped over or otherwise rotated.

At least one pellicle layer 32 is disposed on the first sacrificial layer 31 to define stack 101. Again, the pellicle layer 32 is depicted as surrounding the first sacrificial layer 31, but in alternative embodiments, the membrane layer 32 may only partially surround the first sacrificial layer 31 or be deposited on one face of the stack 100. The pellicle layer 32 may also be known as a pellicle film, membrane layer, pellicle core layer or membrane film.

A single pellicle layer 32 is shown, but it will be appreciated that the pellicle layer 32 may comprise multiple layers. The pellicle layer will comprise at least one pellicle core layer. The pellicle core layer may comprise, for example, polysilicon (pSi) or MoSiNx. The pellicle core layer has two main purposes: to provide mechanical strength to the pellicle layer 32, and to allow transmission of radiation, for example EUV. The pellicle layer 32 may also comprise at least one additional sacrificial layer (not shown).

The stack 101 may also comprise several other layers of materials deposited on the planar substrate 30, the layers having various protective functions in the manufacturing process of the pellicle assembly 15, or for enhancement of the characteristics of the pellicle assembly 15, such as resistance to chemicals/environment and/or improved (thermo-)mechanical strength and/or reduced imaging impact (e.g. by reducing pellicle reflections of EUV radiation or enhancing reflection of undesired, out-of-band radiation such as DUV or IR radiation).

Stack 102 depicts a step in which a first resist 33 is deposited. The first resist 33 may be a positive or negative resist and the method is not particularly limited by which resist is used. The first resist 33 is patterned in order to define the portions of the stack 103 which will be etched in a subsequent etching step. The first resist 33 may also be known as an etch mask.

The stack 102 may then be etched by any suitable etching means to remove a portion of the pellicle layer 32 which is not protected by the resist 33, resulting in stack 103. This etching step may also remove portions of the sacrificial layer 31, or any additional layers described above if so designed.

A protective layer 34 is then applied to the front side of the stack 104, in order to protect the surface at the front face of the stack 104. In particular, the protective layer may protect the layers, particularly pellicle layer 32, at the front side of the stack 104 from a subsequent etching step and/or physical contact. The protective layer 34 may comprise a cross-linked poly(p-xylylene) polymer, for example, preferably a Parylene or ProTEK® type material, or may be a resist, for example KMPR® and/or a TEOS layer. The protective layer 34 is applied as a continuous layer that is substantially free from holes such that it provides a layer which is impermeable to the etchant. The protective layer 34 is preferably not added to the rear (i.e. back-) side of the stack 104 such that the etchant is able to access the planar substrate 30 and any sacrificial layers 31 via the rear side of the stack 104. The optional protective layer 34 is applied to the front side of the stack in order to protect the surface at the front face of the stack. This enables the retention of a clean deposition surface during the following processing steps, prior to deposition of the pellicle layers 32. It will be appreciated that the protective layer 34 may be absent where the etching of the back face of the stack does not pose a risk of damaging the front face of the stack. Even so, a protective layer 34 is preferred.

The stack 104 is then inverted and a second resist 35 is deposited on the rear side of the stack 105. The second resist 35 may be a positive or negative resist and the method is not particularly limited by which resist is used. The second resist 35 is patterned in order to define the portions of the stack 105 which will be etched in a subsequent etching step. The second resist 35 may also be known as an etch mask. It is at this stage in which the ultimate pellicle border region is defined in this process, which is after the pellicle layer has been provided.

At this point in the manufacturing process, contact may occur between the stack 105 and chucks (not shown). The chucks may include, for example, edge contacts, lift pins, end effectors and center wheel contacts used to hold, move and align the stacks. These contacts may take place on the front side of the stack 105 with the pellicle layers 32 present, which provides a high risk for damaging the pellicle layers 32.

The present invention has the advantage of mitigating this risk of damage by providing a different manufacturing process, which will be described in more below with reference to FIG. 4.

Figure 4:
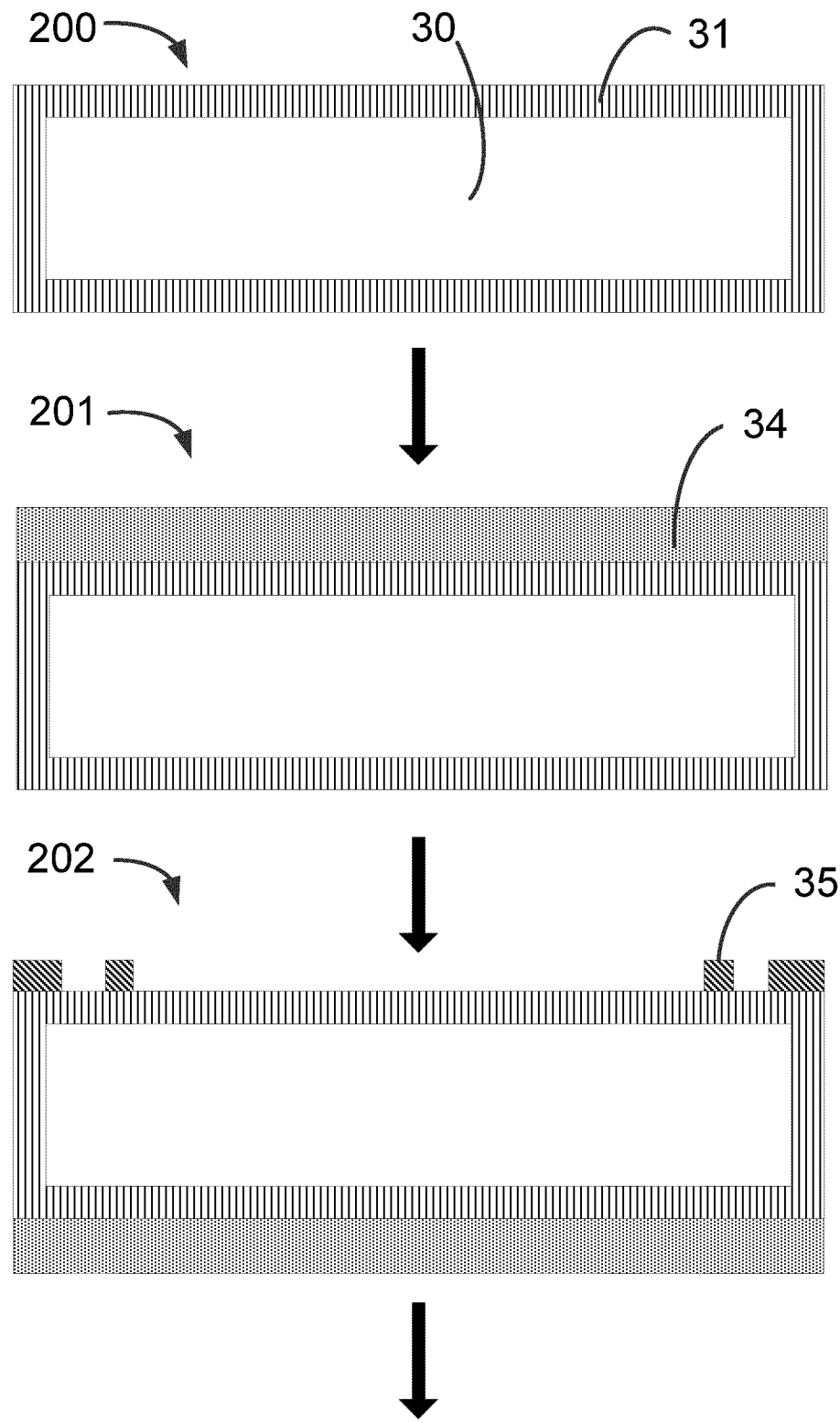
FIG. 4 illustrates stages of manufacture of a pellicle assembly according to an embodiment of the present invention, using a cross-section of the stack for illustration.
Figure 4:
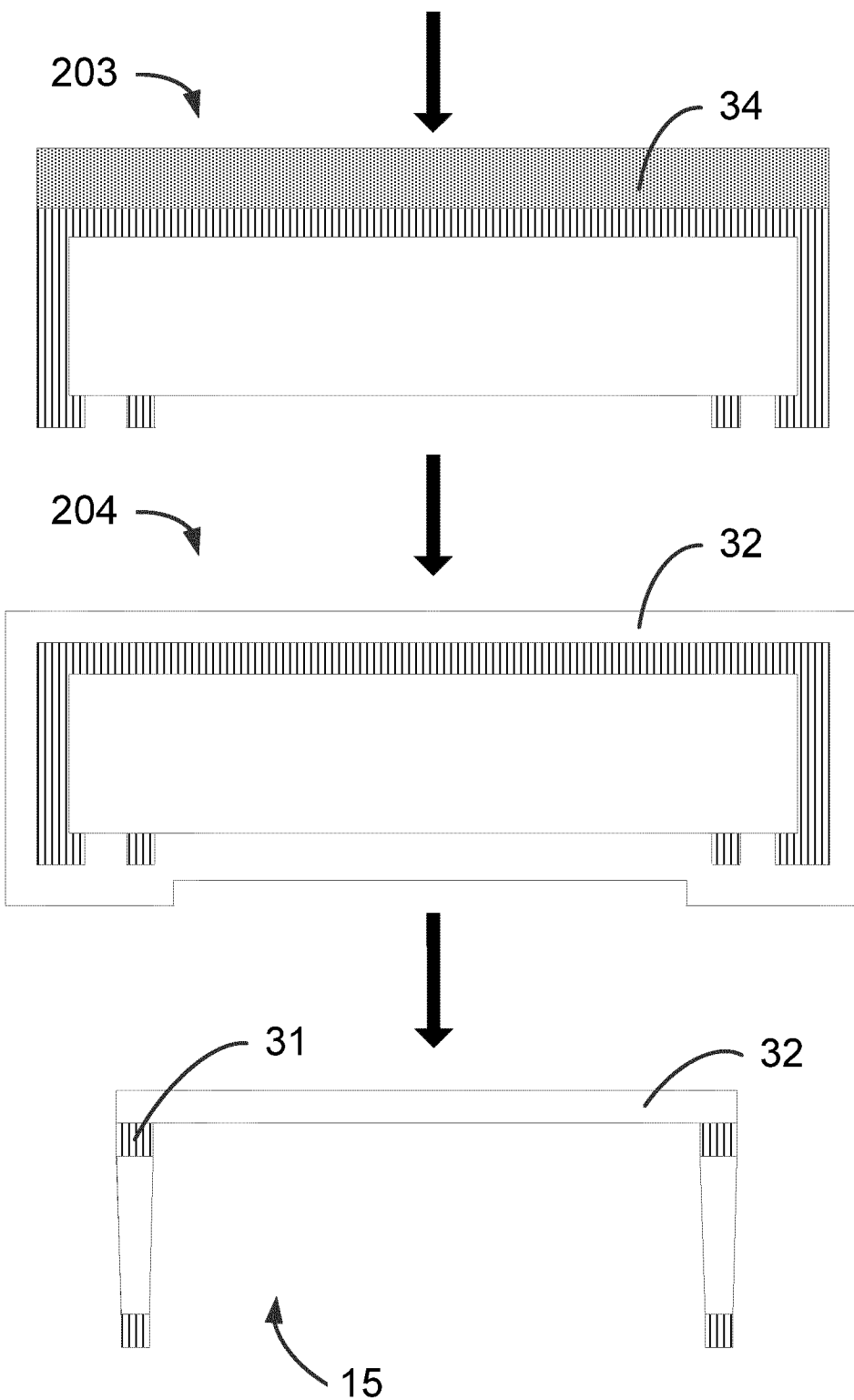

FIG. 4 schematically illustrates stages of manufacture of a pellicle assembly according to an embodiment of the present invention. A cross-section of the stack is used for illustration. The stages of manufacture will be discussed below. Some of the stages and materials are comparable to those described above so will not be described in detail but can be considered equivalent.

A stack 200 is provided, comprising a planar substrate 30 and a first sacrificial layer 31. An optional protective layer 34 is applied to the front side of the stack 200, in order to protect the surface at the front face of the stack 201. This enables the retention of a clean deposition surface during the following processing steps, prior to deposition of the pellicle layers 32. It will be appreciated that the protective layer 34 may be absent where the etching of the back face of the stack does not pose a risk of damaging the front face of the stack. Even so, a protective layer 34 is preferred.

The stack 201 is inverted and a first resist 35 is applied to the rear (i.e. back-) side of the stack 202. The inversion of the stack 201 is optional and it may be possible to carry out the process without inversion. The resist 35 is patterned in order to define the portions of the stack 202 which will be etched in a subsequent etching step and which serve to define the pellicle border of the ultimate pellicle assembly. The stack 202 may then be etched by any suitable etching means to remove a portion of the first sacrificial layer 31 which is not protected by the resist 35. It is at this point that the pellicle border of the ultimate pellicle assembly has been defined and is before the material which provides the ultimate pellicle membrane has been provided. At this point in the manufacturing process, contact may occur between the stack 202 and chucks. These contacts may take place on the front side of the stack 202 without pellicle layers 32 present. As such, the present invention alleviates the high risk of damage to the pellicle layers 32.

The resulting stack 203 may then be used for subsequent deposition of pellicle layers and hence pellicle assembly manufacture. The resulting stack 203 may also be known as a pellicle substrate 203. The pellicle substrate 203 may be retained for a significant period of time prior to further manufacturing steps, without degradation or contamination of the front face of the stack 203. As such, if pellicle layers are damaged in further manufacturing steps, manufacture can recommence from stack 203 (rather than stack 100 in the alternative manufacturing process), reducing the learning time of the process.

Following removal of the protective layer 34, at least one pellicle layer 32 is provided on the stack 203 to define a new stack 204. Again, the pellicle layer 32 is depicted as surrounding the entire stack 203, but in alternative embodiments, the membrane layer 32 may only partially surround the stack 203 or be deposited on one face of the stack 203. The pellicle layer may also be known as a pellicle film, membrane layer, or membrane film.

A single pellicle layer 32 is shown, but it will be appreciated that there may be more than pellicle layer 32 present. The pellicle layer may comprise at least one pellicle core layer. The pellicle core layer may comprise, for example, polysilicon (pSi) or MoSiNx. The pellicle core layer has two main purposes: to provide mechanical strength to the pellicle layer 32, and to allow transmission of radiation, for example EUV.

In alternative embodiments, the pellicle layer 32 may also comprise at least one additional layer, the layers having various protective functions in the manufacturing process of the pellicle assembly 15, or for enhancement of the characteristics of the pellicle assembly 15, such as resistance to chemicals/environment and/or improved (thermo-)mechanical strength and/or reduced imaging impact (e.g. by reducing pellicle reflections) and/or increasing emissivity. For example, it may be the case that the at least one additional layer, such as a boron or a boron-containing layer may have already been provided before the pellicle layer was provided. Some additional embodiments will be described in more detail below and in FIGS. 5-8.

Following deposition of the at least one pellicle layer 32, the stack 204 may be further processed to remove portions of material to form the ultimate pellicle assembly 15. The selective removal of portions of material allows the pellicle assembly 15 to be removed from surrounding portions of planar substrate 30 and sacrificial layers 31. The areas for removal were defined using resist 35. The selective removal of portions of material further defines the pellicle layer 19 and the pellicle border 17. The further processing steps are not of particular relevance to the present invention and, as such, will not be described in detail here. Conventional processing steps include, but are not limited to, application of further resist and/or masking layers. etching steps, and the addition and removal of protective layers.

Further processing steps may take place after removal of the membrane assembly 15 from surrounding portions of the planar substrate 30 and sacrificial layers 31. For example, the pellicle layer 32 of the pellicle assembly 15 may comprise additional sacrificial layers or capping layers as detailed above. These additional layers may be removed or treated in further processing steps.

Figure 5:
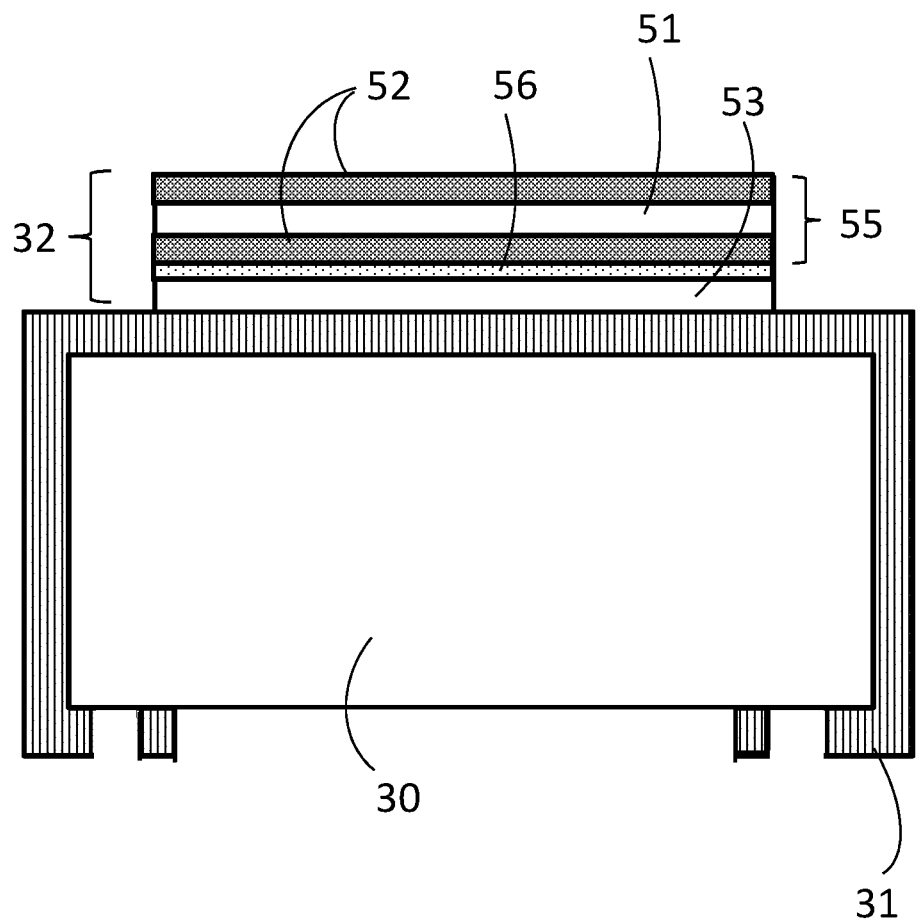
FIG. 5 depicts an embodiment of the present invention following deposition of a plurality of membrane layers.

FIGS. 5 and 6 depict a preferred embodiment of the present invention, wherein the composition of the pellicle layer 32 is further defined. It is a feature of the present invention that depositing the pellicle layer 32 later in the manufacturing process allows for a wider range of materials and layer thicknesses can be used. This is in part due to the deposition of the pellicle layer 32 after the selective removal of one or more portions from the back face of the stack, resulting in reduced risk of damage to the pellicle layer.

In this embodiment, a pellicle layer 32 is deposited, as most clearly depicted in FIG. 5. In this embodiment, the pellicle layer comprises: a pellicle core layer 51, two capping films 52, and a spacing film 53. The pellicle core layer 51 is disposed between the two capping films 52 to form a capped pellicle layer 55. The pellicle core layer may also be referred to as the pellicle film or core film. The spacing film 53 is disposed between the capped pellicle layer 55 and the sacrificial layer 31 Preferably an optional additional spacing layer 56 is provided between the spacing film 53 and the first capping layer 52. This additional optional spacing layer 56 may act as an etch-stop in future etching steps.

The pellicle core layer 51 may comprise, for example, polysilicon (pSi), which has high transmissivity in the EUV, as well as providing strength to the pellicle assembly The spacing film 53 may be made from, for example, a silicon oxide, preferably a thermal oxide. The spacing film 53 defines a surface for receiving further pellicle layers 51, 52. The additional spacing layer 56 may comprise any material which has etch selectivity compared to silicon oxide, for example silicon, or silicon nitride.

The capping layers 52 may be preferably composed of a silicon oxide, for example silicon dioxide ($SiO_2$). The capping layers 52 are preferably thin films compared to the thickness of the pellicle core layer. Thin films of $SiO_2$ may be easily manufactured with well-defined layer thicknesses. A well-defined layer thickness is beneficial to pellicle manufacture as an uneven layer thickness may lead to over-etching and hence damage to the pellicle core layer 51. It is therefore desirable to provide layers of well-defined layer thickness.

Figure 6A:
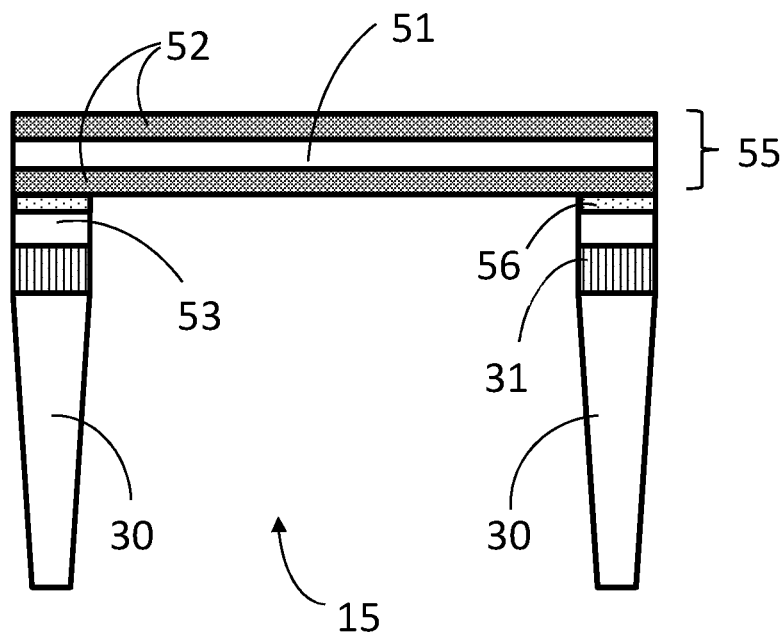
FIG. 6 depicts an embodiment of the present invention, showing the final pellicle assembly before and after a final etch.

As best seen in FIG. 6A, following removal of the pellicle assembly 15 from the surrounding portions of material, the pellicle layer comprises multiple layers. In this preferred embodiment, the pellicle core layer 51 is preferably composed of a silicon, for example polysilicon (pSi), or MoSiNx and the capping layers 52 are preferably composed of a silicon oxide, for example silicon dioxide ($SiO_2$).

Figure 6B:
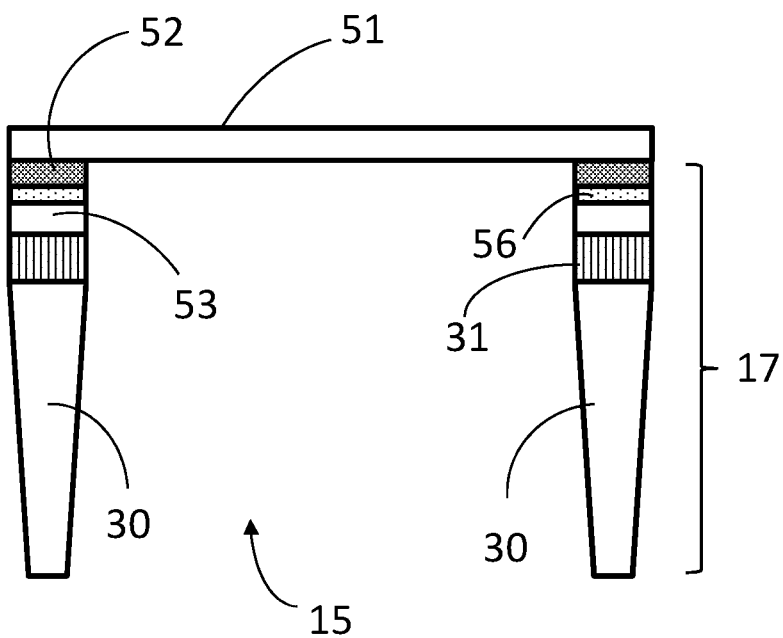

It is desirable to subsequently remove the capping layers 52, leaving only the pellicle core layer 51 as most clearly seen in FIG. 6B. This increases the transmissivity of the pellicle assembly 15. The final pellicle assembly comprises a pellicle core layer 51, supported on a pellicle border 17. The pellicle border 17 comprises a sacrificial layer 31, disposed between a planar substrate 30 and a spacing film 53, wherein said spacing film 53 is disposed between the sacrificial layer 31 and an optional additional spacing film 56, and the spacing film 56 is contiguous with a capping film 52. The pellicle border 17 preferably comprises ordered layers made from a silicon layer, a silicon dioxide layer, a thermal oxide layer, an optional silicon layer, and a silicon dioxide layer; before coming into abutment with a pellicle core layer 51.

The removal of the capping layers 52 can be performed using a number of methods but is preferably performed by etching.

Figure 7:
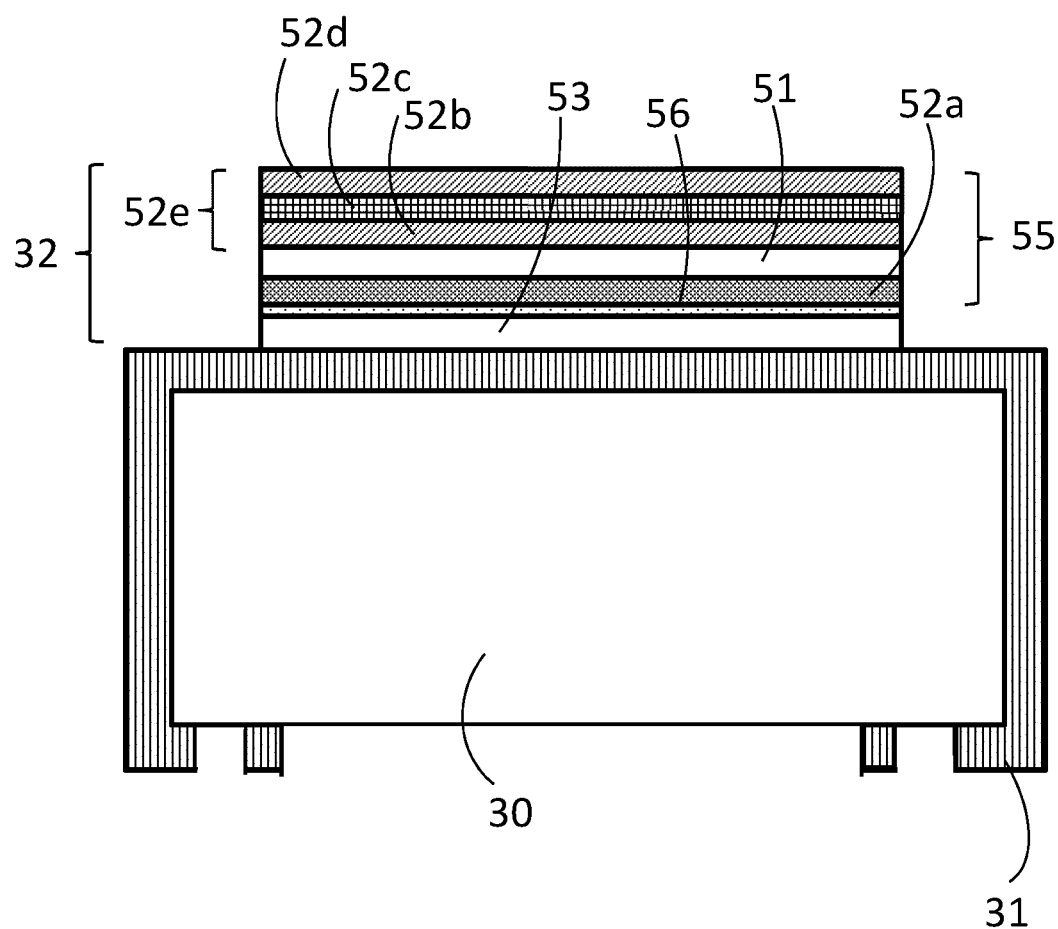
FIG. 7 depicts another embodiment of the present invention following deposition of a plurality of membrane layers.

FIGS. 7 and 8 depict a preferred embodiment of the present invention, wherein the composition of the pellicle layer 32 is further defined. Many features are comparable to those described above and hence will not be described in further detail.

In this embodiment, a pellicle layer 32 is provided on a stack, as most clearly depicted in FIG. 7. The pellicle layer 32 is deposited on the first sacrificial layer 31. In this embodiment the pellicle layer 32 comprises: a pellicle core layer 51, a first capping film 52a, at least one second capping film 52b, and a spacing film 53. Preferably, the pellicle layer 32 may further comprise a third capping film 52c and fourth capping film 52d, wherein the second, third and fourth capping films 52b, 52c, 52d comprise an upper capping layer 52e, also known as an emissive film. The pellicle core layer 51 is disposed between the first capping film 52a and the emissive film 52e to form a capped pellicle layer 55. The spacing film 53 is disposed between the capped pellicle layer 55 and the sacrificial layer 31. As in the previous embodiment, an additional optional spacing layer 56 may be provided between the spacing film 53 and the first capping film 52a. This additional spacing layer 56 acts as an etch-stop in future etching step.

The pellicle core layer 51 is preferably composed of a silicon, for example polysilicon (pSi), or MoSiNx which has high transmissivity in the EUV, as well as providing strength to the pellicle assembly The spacing film 53 is preferably composed of a silicon oxide, for example silicon dioxide ($SiO_2$), or a thermal oxide, for example a thermally treated $SiO_2$ The spacing film 53 defines a flat surface for receiving further pellicle layers 51, 52a, 52b, 52c, 52d. The additional optional spacing layer 56 may comprise any material which has etch selectivity compared to silicon oxide, for example silicon, or silicon nitride.

The first capping layer 52a is preferably composed of a silicon oxide, for example silicon dioxide ($SiO_2$). The first capping layer 52a is preferably a thin film, compared to the thickness of the pellicle core layer 51.

The at least one second capping film 52b may preferably be metallic. In a preferred embodiment, the second, third and fourth capping films 52b, 52c, 52d may all be metallic. In this preferred embodiment, the second capping film 52b and fourth capping film 52d are preferably composed of boron or a boron-containing material, and the third capping film 52c is composed of zirconium or a zirconium-containing material. This upper capping film 52e may provide strength and/or increased emissivity to the resulting pellicle assembly 15.

This embodiment is advantageous over the prior art as, previously, emissive layers were deposited onto the pellicle membrane following removal from the surrounding portions of material, also known as deposition onto a free-standing pellicle. Significant manufacturing difficulties arise from deposition onto a free-standing pellicle. The present invention allows the deposition of emissive layers prior to removal, hence avoiding these problems.

Figure 8A:
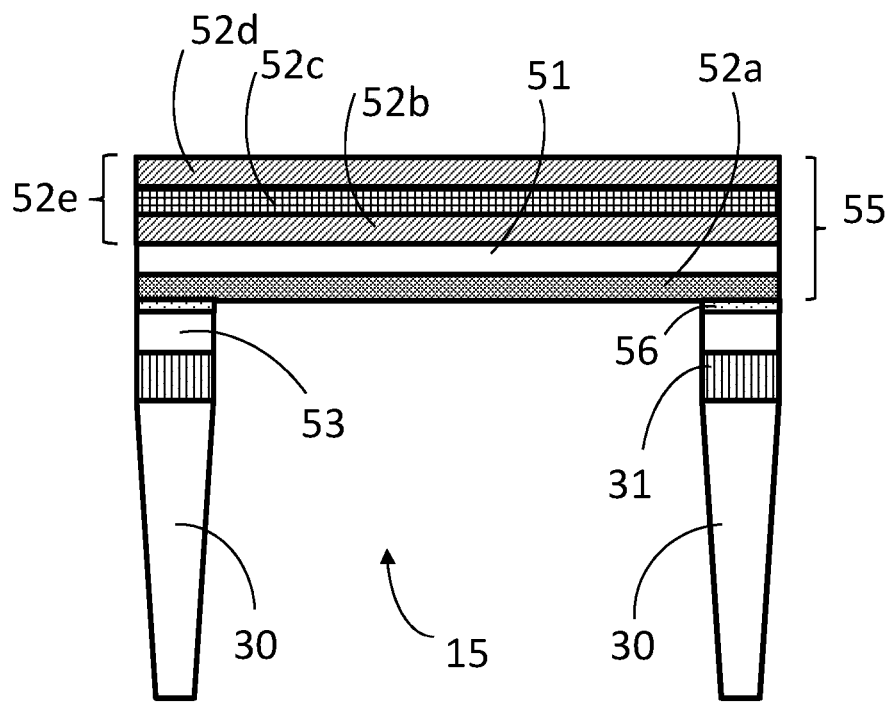
FIG. 8 depicts another embodiment of the present invention, showing the final pellicle assembly before, and after, a final etch.

As most clearly seen in FIG. 8A, following removal of the pellicle assembly 15 from the surrounding portions of material, the pellicle layer comprises multiple layers including a pellicle core layer 51 disposed between a first capping film 52a and an emissive film 52e. It is desirable to subsequently remove the first capping layer 52a, leaving only the pellicle core layer 51 and the emissive film 52e. This increases the emissivity of the pellicle assembly 15 while retaining mechanical strength.

Figure 8B:
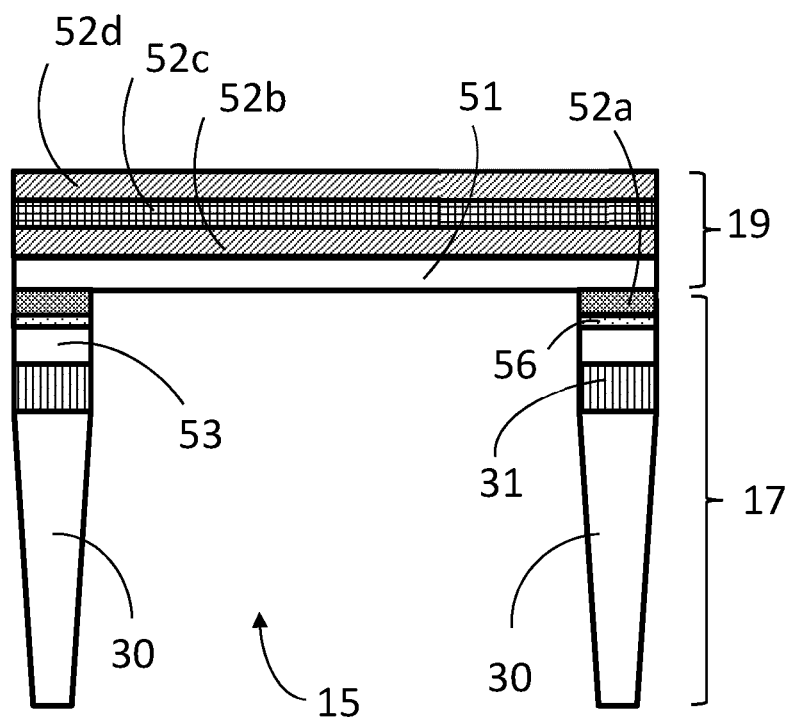

The final pellicle assembly 15 of this embodiment is most clearly seen in FIG. 8B. The pellicle assembly 15 comprises pellicle layer 19, supported on a pellicle border 17, the pellicle border 17 comprising portions of a capping layer 52a, an optional spacing layer 56, a spacing layer 53, a sacrificial layer 31, and a planar substrate 30. The optional spacing layer 56 may be further defined as comprising a sacrificial layer 31, disposed between a planar substrate 30 and a spacing film 53, wherein said spacing film 53 is disposed between the sacrificial layer and the optional spacing film 56, and the spacing film is contiguous with a capping film 52a. The optional spacing layer 56 preferably comprises a ordered layers made from a silicon layer, a silicon dioxide layer, a thermal oxide layer, an optional silicon layer, and a silicon dioxide layer, before coming into abutment with a pellicle core layer 51.

Figure 9:
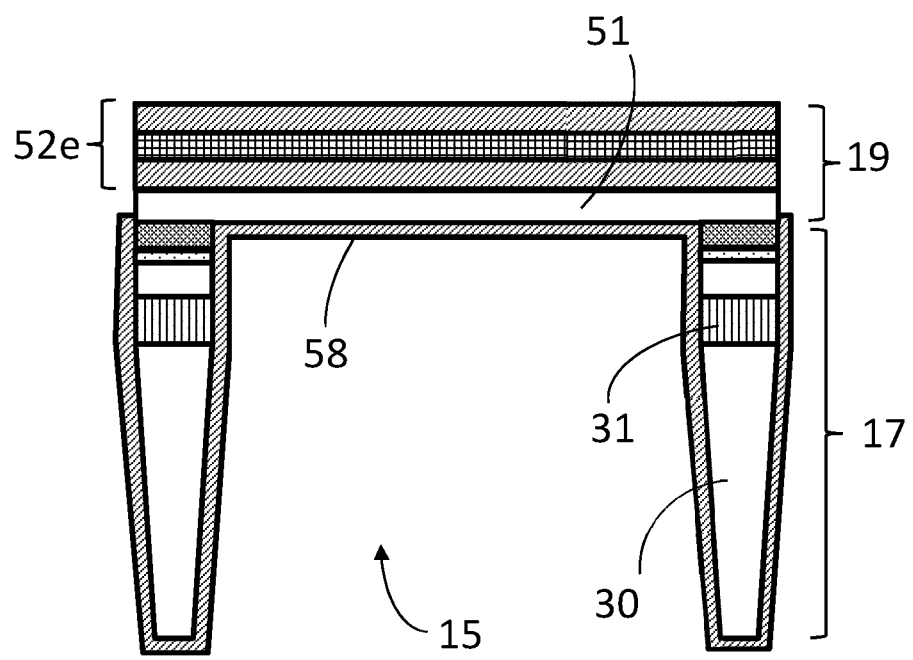
FIG. 9 depicts an embodiment of a pellicle assembly in which an emissive layer is provided on the back side of the assembly.

The pellicle layer 19 may be further defined as comprising a pellicle core layer 51, preferably composed of a silicon-based material such as pSi or MoSiNx, in abutment with the pellicle border 17, and a emissive layer 52e, preferably metallic, wherein the pellicle core layer 51 is disposed between the pellicle border 17 and the emissive film 52e. Optionally, at least one additional emissive layer 58 may be added to the pellicle layer, for example as depicted in FIG. 9. The at least one additional emissive layer 58 may preferably be metallic. For example, the emissive layer may comprise boron or a boron-containing material, or zirconium or a zirconium-containing material. This additional emissive layer 58 may provide strength and/or increased emissivity to the resulting pellicle assembly 15. The at least one additional emissive 58 layer may be provided following removal of sections of the planar substrate 30 and sacrificial layer 31, but before the pellicle assembly 15 has been fully removed from the surrounding planar substrate 30 and sacrificial layer 31 or optional protective layers.

The optional at least one additional emissive layer 58 may be provided to the underside (i.e. rear or back side) of the pellicle layer 19, defined as the plane of the pellicle layer 19 in abutment with the pellicle border 17. That is, the additional emissive layer 58 may be provided within the area of the pellicle layer 19 contained within the cavity defined by the pellicle border 17. The additional emissive layer may also be provided to the outer areas of the pellicle border 17. As depicted in the embodiment in FIG. 9, the final pellicle assembly 15 may comprise a pellicle core layer 51 between two emissive layers 52e, 58. The final pellicle assembly 15 may additionally comprise an emissive layer 58 at least partially surrounding the pellicle border 17.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The figures are intended to be illustrative and are, as such, not drawn to scale. This is of particular importance when considering the thickness of, for example, pellicle layers with respect to, for example, the planar substrate.

While specific embodiments of the invention have been described above, it will be appreciated that the invention may be practiced otherwise than as described. For example, the various layers may be replaced by other layers that perform the same function.

The descriptions above are intended to be illustrative, not limiting. Thus it will be apparent to one skilled in the art that modifications may be made to the invention as described without departing from the scope of the claims set out below.

Embodiments are provided according to the following clauses:

1. A method of manufacturing a membrane assembly for EUV lithography, wherein a layer which forms at least part of a pellicle membrane is provided after one or more etching steps which define a pellicle border holding the pellicle membrane.
2. A method of manufacturing a pellicle assembly according to Clause 1, the method comprising providing a stack having a front face and a back face.
3. A method of manufacturing a pellicle assembly according to Clause 2, the method comprising providing a protective layer on the front face of the stack.
4. A method of manufacturing a pellicle assembly according to Clause 2 or 3, the method comprising selectively removing one or more portions from the back face of the stack.
5. A method of manufacturing a pellicle assembly according to Clause 3 or 4, the method comprising removing at least a portion of the protective layer from the front face of the stack.
6. A method of manufacturing a pellicle assembly according to any of Clauses 2 to 5, the method comprising providing the layer which forms at least part of a pellicle membrane on the front face of the stack.
7. A method of manufacturing a pellicle assembly according to any of Clauses 2 to 6, the method comprising selectively removing one or more portions of the stack to form a pellicle assembly, the pellicle assembly comprising: a pellicle membrane comprising the at least one membrane layer, and a pellicle border holding the membrane.
8. A method of manufacturing a pellicle assembly according to any of Clauses 2 to 7, the method further comprising: providing at least one emissive layer on the front face of the stack preferably after the at least one membrane layer has been provided, such that the pellicle assembly comprises a membrane comprising the at least one membrane layer and the at least one emissive layer.
9. A method of manufacturing a pellicle assembly according to any of Clauses 2 to 8, the method further comprising: providing at least one capping layer on the front face of the stack, wherein said capping layer preferably comprises silicon oxide and/or silicon dioxide and/or silicon nitride.
10. The method according to of Clauses 2 to 9, wherein the method further comprises providing a resist on the stack and patterning the resist prior to selectively removing one or more portions from the back face of the stack.
11. The method according to Clause 10 wherein the method further comprises etching at least a portion of the stack during the step of selectively removing one or more portions from the back face of the stack and/or the step of selectively removing one or more portions of the stack to form a pellicle assembly.
12. The method according to Clause 11 wherein the etchant comprises phosphoric acid and/or hydrofluoric acid.
13. The method according to any of Clauses 2 to 12, wherein the stack comprises a planar substrate, and preferably at least one sacrificial layer.
14. The method according to Clause 13, wherein the planar substrate is a wafer, optionally a silicon wafer.
15. The method according to Clause 13 or 14, wherein the at least one sacrificial layer comprises silicon nitride, silicon oxide, tetraethyl orthosilicate (TEOS), a chemical silicon oxide or a thermal silicon oxide.
16. The method according to any preceding Clause, wherein the at least one membrane layer comprises at least one silicon layer preferably formed by crystallizing at least one amorphous silicon layer, or a MoSiNx layer, and/or where the least one protective layer comprises a cross-linked polymer, preferably a poly(p-xylylene) polymer, preferably a Parylene or ProTEK® type material or a resist, such as KMPR™.
17. The method according to any of Clauses 8 to 16, wherein the at least one membrane layer is provided so as to be disposed between the at least one emissive layer and a face of the stack; and preferably wherein the at least one emissive layer is metallic.
18. The method according to any of Clauses 8 to 17, wherein the at least one emissive layer comprises boron, Zr, Mo and/or Ru.
19. The method according to any of Clause 8 to 18, wherein the at least one emissive layer comprises a plurality of emissive sub-layers, and preferably wherein the emissive sub-layers are metallic.
20. The method according to Clause 19, wherein the emissive layers comprise a zirconium-containing layer disposed between two boron-containing layers.
21. The method according to any of Clause 9 to 20, wherein the at least one capping layer has capping layer thickness, the at least one membrane layer has a membrane layer thickness, and wherein the capping layer thickness is less than the membrane layer thickness.
22. The method according to any of Clauses 9 to 21, wherein the method further comprises the selective removal of at least one portion of the at least one capping layer after selectively removing one or more portions of the stack to form a pellicle assembly.
23. The method according to any preceding Clause, wherein the at least one membrane layers and/or at least one capping layers and/or at least one emissive layers further comprise at least one sacrificial layer.
24. The method according to Clause 11 or 12, wherein after etching the resulting pellicle membrane comprises a MoSiNx core layer with no further functional cap layers, or a MoSiNx core layer having at least one surface covered with a native oxide layer.
25. The method according to Clause 11 or 12, wherein after etching and metal deposition the stack is formed by SiN/Ox on the front face, a pSi pellicle core layer, a low stress nitride (LSN) layer and a cap layer of Ru on Mo deposited on the back face of the stack.
26. A pellicle substrate, the substrate comprising:
a stack having a front face and back face,
wherein one or more layers on the back face of the stack have been selectively removed to define a pellicle border region for holding the pellicle membrane before the layer which forms at least part of a pellicle membrane has been provided.
27. The pellicle substrate according to Clause 26, wherein the pellicle substrate further comprises at least one protective layer on the front face of the stack, preferably the at least one protective layer comprises a cross-linked polymer, preferably a poly(p-xylylene) polymer, preferably a Parylene or ProTEK® type material or a resist, such as KMPR™.
28. The pellicle substrate according to one of Clauses 26 or 27, wherein the stack comprises a planar substrate, and preferably at least one sacrificial layer; preferably wherein the planar substrate is a wafer, optionally a silicon wafer or a SOI wafer; and preferably wherein the at least one sacrificial layer comprises silicon nitride.
29. The pellicle substrate according to Clause 26 comprising a pellicle core layer selected from a silicon-based material, such as pSi, SiC, MoSi$_2$ or MoSiNx, or a carbon-based material, such as a graphene film or a film of carbon nanotubes.

30. The pellicle substrate according to Clause 26, wherein the stack comprises two or more layers of SiO/MoSiNx/MoSi$_2$, or comprises layers of two of more layers of SiON/MoSiNx/SiON.

31. A lithography apparatus comprising a pellicle assembly manufactured according to the method of any of Clauses 1 to 25.

The invention claimed is:

1. A method of manufacturing a membrane assembly for EUV lithography, wherein a layer which forms at least part of a pellicle membrane is provided at a first side of the assembly prior to etching, if any, at the first side and after one or more etching steps which define a pellicle border holding the pellicle membrane at a second side of the assembly opposite the first side.

2. The method according to claim 1, further comprising providing a stack having a front face and a back face.

3. The method according to claim 2, further comprising providing at least one emissive layer on the front face of the stack such that the pellicle assembly comprises a membrane comprising at least one membrane layer and the at least one emissive layer.

4. The method according to claim 2, further comprising providing at least one capping layer on the front face of the stack.

5. The method according to claim 2, further comprising providing a resist on the stack and patterning the resist prior to selectively removing one or more portions from the back face of the stack.

6. The method according to claim 5, further comprising etching at least a portion of the stack during selectively removing one or more portions from the back face of the stack and/or further comprising selectively removing one or more portions of the stack to form a pellicle assembly.

7. The method according to claim 2, wherein the stack comprises a planar substrate.

8. The method according to claim 7, wherein the substrate comprises at least one sacrificial layer that comprises silicon nitride, silicon oxide, tetraethyl orthosilicate (TEOS), a chemical silicon oxide or a thermal silicon oxide.

9. The method according to claim 1, wherein at least one membrane layer comprises at least one silicon layer, or a MoSiNx layer, and/or where at least one protective layer is provided and comprises a cross-linked polymer or a resist.

10. The method according to claim 3, wherein the at least one membrane layer is provided so as to be disposed between the at least one emissive layer and a face of the stack.

11. The method according to claim 3, wherein the at least one emissive layer comprises boron, Zr, Mo and/or Ru.

12. The method according to claim 3, wherein the at least one emissive layer comprises a plurality of emissive sub-layers.

13. The method according to claim 6, wherein after etching, the resulting pellicle membrane comprises a MoSiNx core layer with no further functional cap layers, or a MoSiNx core layer having at least one surface covered with a native oxide layer.

14. The method according to claim 6, wherein after etching and metal deposition, the stack comprises SiN/Ox at the front face, a pSi pellicle core layer, a low stress nitride (LSN) layer and a cap layer of Ru on Mo deposited at the back face.

15. A lithography apparatus comprising a pellicle assembly manufactured according to the method of claim 1.

16. A pellicle substrate, the substrate comprising:
a stack having a front face and back face,
wherein at least part of one or more layers on the back face of the stack have been selectively removed to define a pellicle border region for holding the pellicle membrane before a layer which forms at least part of a pellicle membrane has been provided to the front face, wherein the layer which forms at least part of the pellicle membrane is provided at the front face prior to etching, if any, at the front face.

17. The pellicle substrate according to claim 16, further comprising at least one protective layer on the front face of the stack.

18. The pellicle substrate according to claim 16, wherein the stack comprises a planar substrate.

19. The pellicle substrate according to claim 16, comprising a pellicle core layer selected from a silicon-based material or a carbon-based material.

20. The pellicle substrate according to claim 16, wherein the stack comprises two or more layers of SiO/MoSiNx/MoSi$_2$, or comprises layers of two of more layers of SiON/MoSiNx/SiON.

* * * * *